(12) United States Patent
Cela Greven et al.

(10) Patent No.: US 10,829,407 B2
(45) Date of Patent: Nov. 10, 2020

(54) CONDUCTIVE PASTE, METHOD, ELECTRODE AND SOLAR CELL

(71) Applicant: JOHNSON MATTHEY PUBLIC LIMITED COMPANY, London (GB)

(72) Inventors: Beatriz Cela Greven, Maastricht (NL); Edwin Peter Kennedy Currie, Maastricht (NL); Jonathan Charles Shepley Booth, Berkshire (GB); Simon Johnson, Berkshire (GB); Tobias Droste, Muehltal (DE)

(73) Assignee: Johnson Matthey Public Limited Company, London (GB)

( * ) Notice: Subject to any disclaimer, the term of this patent is extended or adjusted under 35 U.S.C. 154(b) by 0 days.

(21) Appl. No.: 16/071,520

(22) PCT Filed: Dec. 21, 2016

(86) PCT No.: PCT/GB2016/054012
§ 371 (c)(1),
(2) Date: Jul. 20, 2018

(87) PCT Pub. No.: WO2017/125710
PCT Pub. Date: Jul. 27, 2017

(65) Prior Publication Data
US 2019/0031557 A1 Jan. 31, 2019

(30) Foreign Application Priority Data

Jan. 20, 2016 (GB) .................................. 1601034.0

(51) Int. Cl.
*H01B 1/22* (2006.01)
*C03C 8/18* (2006.01)
(Continued)

(52) U.S. Cl.
CPC ................ *C03C 8/18* (2013.01); *C03C 3/122* (2013.01); *C03C 3/14* (2013.01); *C03C 4/14* (2013.01);
(Continued)

(58) Field of Classification Search
CPC ................... G01C 21/32; H01B 1/22
(Continued)

(56) References Cited

U.S. PATENT DOCUMENTS

2004/0220732 A1* 11/2004 Smith .................... G01C 21/32
701/410
2011/0227004 A1 9/2011 Jung et al.
(Continued)

FOREIGN PATENT DOCUMENTS

CN 104778988 A 7/2015
EP 2323171 A1 5/2011
(Continued)

OTHER PUBLICATIONS

GB 1601034.0 Search Report Under Section 17(6) dated Sep. 29, 2016.
(Continued)

*Primary Examiner* — Khanh T Nguyen
(74) *Attorney, Agent, or Firm* — BakerHostetler

(57) ABSTRACT

The present invention relates to a conductive paste for forming a conductive track on a substrate, the paste comprising a solids portion dispersed in an organic medium, the solids portion comprising an electrically conductive material, particles of a glass fit and particles of a tellurium compound. The invention further relates to methods for preparing such a paste, to a method of manufacturing an electrode on a surface of a solar cell, and to a solar cell having an electrode formed thereon.

12 Claims, 1 Drawing Sheet

(51) Int. Cl.
*C03C 3/12* (2006.01)
*C03C 3/14* (2006.01)
*C03C 4/14* (2006.01)
*C03C 8/04* (2006.01)
*H01L 31/0224* (2006.01)

(52) U.S. Cl.
CPC ............... *C03C 8/04* (2013.01); *H01B 1/22* (2013.01); *H01L 31/022425* (2013.01); *C03C 2204/00* (2013.01); *C03C 2205/00* (2013.01)

(58) Field of Classification Search
USPC .......................................... 701/410; 136/256
See application file for complete search history.

(56) References Cited

U.S. PATENT DOCUMENTS

| | | |
|---|---|---|
| 2012/0313198 A1 | 12/2012 | Ittel et al. |
| 2013/0180583 A1 | 7/2013 | Borland et al. |
| 2013/0269773 A1 | 10/2013 | Wang et al. |
| 2013/0284250 A1 | 10/2013 | Hang et al. |
| 2014/0021417 A1 | 1/2014 | Koike et al. |
| 2015/0021527 A1 | 1/2015 | Shin et al. |
| 2015/0060742 A1* | 3/2015 | Glicksman ................ C03C 8/02 252/514 |
| 2015/0075597 A1 | 3/2015 | Kurtz et al. |
| 2015/0107664 A1 | 4/2015 | Choi et al. |
| 2015/0155401 A1* | 6/2015 | Kurtz ....................... H01B 1/22 136/256 |
| 2015/0303325 A1 | 10/2015 | Song et al. |
| 2016/0005890 A1 | 1/2016 | Kim et al. |
| 2016/0163893 A1* | 6/2016 | Yeh ........................ C03C 3/062 136/256 |
| 2016/0005888 A1 | 7/2016 | Kim et al. |

FOREIGN PATENT DOCUMENTS

| | | |
|---|---|---|
| EP | 2654086 A1 | 10/2013 |
| TW | 201517057 A | 5/2015 |
| TW | 201602035 A | 1/2016 |
| TW | 201602045 A | 1/2016 |
| WO | WO 2014/098351 A1 | 6/2014 |
| WO | WO 2014/196712 A1 | 12/2014 |
| WO | WO 2015/166226 A1 | 11/2015 |

OTHER PUBLICATIONS

PCT/GB2016/054012 International Search Report and Written Opinion dated Mar. 9, 2017.

* cited by examiner

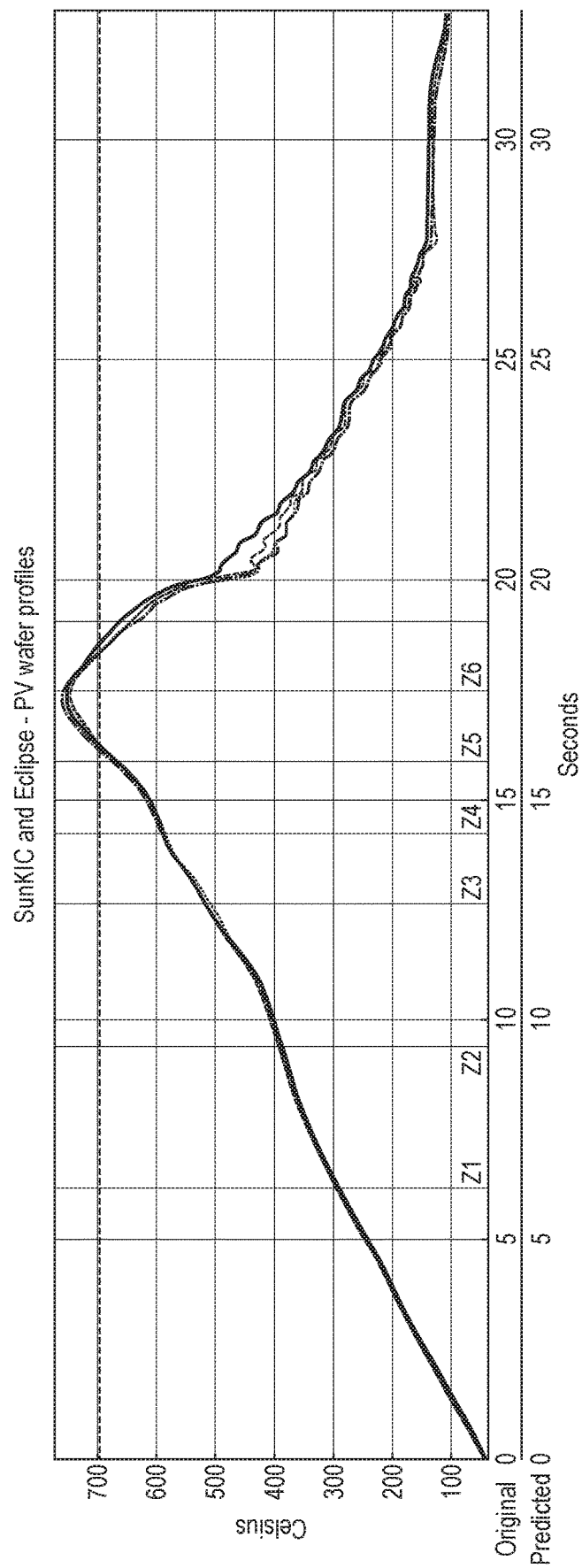

CONDUCTIVE PASTE, METHOD, ELECTRODE AND SOLAR CELL

CROSS-REFERENCE TO RELATED APPLICATIONS

This application is the National Stage of International Patent Application No. PCT/GB2016/054012, filed Dec. 21, 2016, which claims priority from Great Britain Patent Application No. 1601034.0, filed Jan. 20, 2016, the disclosures of each of which are incorporated herein by reference in their entireties for any and all purposes.

FIELD OF THE INVENTION

The present invention relates to conductive pastes which are particularly suitable for use in solar cells and methods for making those, to a method of manufacturing an electrode on a surface e.g. of a solar cell, and to a surface of a solar cell having an electrode formed thereon.

BACKGROUND OF THE INVENTION

Screen printed conductive (e.g. silver) pastes are routinely used as conductive tracks for solar cells, such as silicon solar cells. The pastes typically comprise conductive (e.g. silver) powder, glass frit, and sometimes one or more additional additives, all dispersed in an organic medium. The glass frit has several roles. During firing, it becomes a molten phase and so acts to bond the conductive track to the semiconductor wafer. However, the glass frit is also important in etching away the anti-reflective or passivation layer (usually silicon nitride) provided on the surface of the semiconductor wafer, to permit direct contact between the conductive track and the semiconductor. The glass frit is typically also important in forming an ohmic contact with the semiconductor emitter.

The quality of the contact between the conductive track and the semiconductor wafer is instrumental in determining the efficiency of the final solar cell. The best glass frits need to be optimised to flow at the correct temperature, and to provide the correct degree of etching of the antireflective layer. If too little etching is provided, then there will be insufficient contact between the semiconductor wafer and the conductive track, resulting in a high contact resistance. Conversely, excessive etching may lead to deposition of large islands of silver in the semiconductor, disrupting its p-n junction and thereby reducing its ability to convert solar energy into electrical energy.

Much recent attention has focused on improving the glass frit materials included in conductive pastes for photovoltaic cells, to provide a good balance of properties.

Conductive pastes comprising conductive powder, glass frit, and sometimes one or more additional additives, all dispersed in an organic medium, are also used to form conductive tracks or conductive coatings in a range of other electronics applications, including passive electronic components, e.g. in terminal electrodes for zinc oxide varistor components, terminations for MLCC (multi-layer ceramic capacitors), electrodes on TCO (transparent conductive oxide) coated glass substrate, conductive layers on NTC (negative temperature coefficient) thermistors, metallization of functional piezoceramics; and automotive applications including backlights, sidelights, heatable mirrors and windscreens, and antennae.

SUMMARY OF THE INVENTION

There remains a need for glass frits which are suitable for use in conductive pastes for solar cells, which offer a good balance of properties. In particular, there remains a need for conductive pastes for solar cells which provide an excellent (lowered) contact resistance without negatively influencing the p-n junction of a solar cell, and which include glass frit which flows at a suitable temperature for firing the conductive paste during manufacture of a solar cell.

In a first aspect, the present invention provides a conductive paste for forming a conductive track on a substrate, the paste comprising a solids portion dispersed in an organic medium, the solids portion comprising an electrically conductive material, particles of a bismuth-cerium, bismuth-molybdenum, bismuth-tungsten, or bismuth-alkali metal glass frit and particles of a tellurium compound.

The content ratio of glass frit to tellurium compound may be 4:1 to 11:9 w/w. The glass frit may contain less than 10 wt % of tellurium compound. The D90 particle size of the glass frit particles may be 2 μm or less, and/or the D90 particle size of the tellurium compound particles may be 2 μm or less. The D50 particle size of the glass frit particles may be 1 μm or less, and/or the D50 particle size of the tellurium compound particles may be 1 μm or less.

The tellurium compound of the present invention may be a telluride or a tellurite. For example, it may be selected from tellurium chloride, tellurium dioxide, tellurious acid compounds, zinc telluride, tellurium tetrabromide, aluminium telluride, cadmium telluride, hydrogen telluride, potassium telluride, sodium telluride, lithium telluride, gallium telluride, silver telluride, chromium telluride, germanium telluride, cobalt telluride, mercury telluride, tin telluride, tungsten telluride, titanium telluride, copper telluride, lead telluride, bismuth telluride, arsenic telluride, manganese telluride, molybdenum telluride, telluric acid, ammonium metatelluric acid, potassium metatelluric acid, rubidium metatelluric acid, sodium metatelluric acid, lead metatelluric acid, tellurium iodide, tellurium sulfide, diphenylditelluride, tellurium octylate, bismuth tellurite, silver tellurite, lithium tellurite, sodium tellurite, molybdenum tellurite, tungsten tellurite, zinc tellurite, and mixtures thereof.

In a third aspect the present invention provides a method of preparing a conductive paste comprising mixing an organic medium, an electrically conductive material, particles of a glass frit and particles of a tellurium compound, in any order.

The particles of the glass frit and the particles of the tellurium compound may be added or used together as a particle mixture. The method may further comprise co-milling the particles of the glass frit and the particles of the tellurium compound to form the particle mixture. The method may comprise mixing the organic medium, the electrically conductive material, the particle mixture and additional particles of the glass frit, in any order.

In a fourth aspect, the present invention provides a method of preparing a conductive paste, comprising the steps of co-milling particles of a glass frit and particles of a tellurium compound to form a particle mixture; and mixing the particle mixture together with an organic medium and an electrically conductive material, in any order.

The method may comprise mixing the organic medium, the electrically conductive material, the particle mixture and additional particles of the glass frit, in any order.

In a fifth aspect, the present invention provides a conductive paste manufactured by a method of the third or fourth aspect.

In a sixth aspect, the present invention provides a method for the manufacture of a surface electrode of a solar cell, the method comprising applying a conductive paste of the first, second or fifth aspect to a semiconductor substrate, and firing the applied conductive paste.

In a seventh aspect, the present invention provides an electrode for a solar cell, the electrode comprising a conductive track on a semiconductor substrate, wherein the conductive track is obtained or obtainable by firing a paste of the first, second or fifth aspect on the semiconductor substrate.

In an eighth aspect, the present invention provides a solar cell comprising a surface electrode of the seventh aspect.

In a ninth aspect, the present invention provides use of a conductive paste of the first, second or fifth aspect in the manufacture of a surface electrode of a solar cell.

BRIEF DESCRIPTION OF THE DRAWINGS

FIG. 1 shows an example firing curve for a solar cell prepared in the Examples.

DETAILED DESCRIPTION

Preferred and/or optional features of the invention will now be set out. Any aspect of the invention may be combined with any other aspect of the invention unless the context demands otherwise. Any of the preferred and/or optional features of any aspect may be combined, either singly or in combination, with any aspect of the invention unless the context demands otherwise.

Conductive pastes of the present invention include an organic medium and a solids portion. The solids portion includes an electrically conductive material, particles of a glass frit and particles of a tellurium compound. Each of these will be discussed, as will various methods of using them to make a conductive paste.

Tellurium Compound

The conductive pastes of the present invention include particles of a tellurium compound. That is, there are discrete particles of the tellurium compound present in the paste. In other words, at least some of the particles of the tellurium compound are not joined, bound or fused to other particles.

The particle size of the tellurium compound may be controlled in the present invention. Typically, the D50 particle size may be at least 0.1 μm, at least 0.4 μm, at least 0.5 μm, at least 0.6 μm, at least 0.7 μm, or at least 1 μm. The D50 particle size may be 15 μm or less, 10 μm or less, 5 μm or less, 4 μm or less, 3 μm or less, 2 μm or less, 1 μm or less, 0.9 μm or less or 0.8 μm or less. The particle size may be determined using a laser diffraction method (e.g. using a Malvern Mastersizer 2000).

Alternatively or additionally (with the caveat that, of course, the D90 particle size is always higher than the D50 particle size), the D90 particle size may be at least 0.1 μm, at least 0.5 μm, at least 1 μm, at least 1.4 μm, at least 1.5 μm, at least 1.6 μm, at least 1.7 μm or at least 1.8 μm. The D90 particle size may be 15 μm or less, 10 μm or less, 5 μm or less, 4 μm or less, 3 μm or less, 2 μm or less, 1.9 μm or less, 1.8 μm or less, 1.7 μm or less, 1.6 μm or less or 1 μm or less. The particle size may be determined using a laser diffraction method (e.g. using a Malvern Mastersizer 2000).

The solids portion of the conductive paste of the present invention may include 0.1 to 15 wt % of the tellurium compound. The solids portion of the conductive paste may include at least 0.2 wt %, for example at least 0.4 wt %, or at least 0.5 wt %, or at least 0.6 wt %, or at least 0.8 wt % or at least 1 wt % of the tellurium compound. The solids portion of the conductive paste may include 10 wt % or less, 7 wt % or less, 5 wt % or less, 3 wt % or less or 2 wt % or less of the tellurium compound.

The tellurium compound may be, for example, a telluride or tellurite. By telluride, it is meant a compound in which tellurium is present in the form of $Te^{2-}$ ions. By tellurite, it is meant a compound in which tellurium is present in the form of $TeO_3^{2-}$ ions.

For example, the tellurium compound may be chosen from tellurium chloride, tellurium dioxide, tellurious acid compounds, zinc telluride, tellurium tetrabromide, aluminium telluride, cadmium telluride, hydrogen telluride, potassium telluride, sodium telluride, lithium telluride, gallium telluride, silver telluride, chromium telluride, germanium telluride, cobalt telluride, mercury telluride, tin telluride, tungsten telluride, titanium telluride, copper telluride, lead telluride, bismuth telluride, arsenic telluride, manganese telluride, molybdenum telluride, telluric acid, ammonium metatelluric acid, potassium metatelluric acid, rubidium metatelluric acid, sodium metatelluric acid, lead metatelluric acid, tellurium iodide, tellurium sulfide, diphenylditelluride, tellurium octylate, bismuth tellurite, silver tellurite, lithium tellurite, sodium tellurite, molybdenum tellurite, tungsten tellurite and zinc tellurite or mixtures thereof.

One or more tellurium compounds may make up the "tellurium compound" described herein. The discrete particles may be of one or more different tellurium compounds.

Suitably, the tellurium compound is selected from tellurium dioxide ($TeO_2$), bismuth tellurite, silver tellurite, lithium tellurite, sodium tellurite, molybdenum tellurite, tungsten tellurite, zinc tellurite, bismuth telluride, silver telluride, lithium telluride, sodium telluride, molybdenum telluride, tungsten telluride, zinc telluride, and mixtures thereof. In certain embodiments, the tellurium compound is $TeO_2$.

Glass Frit

The glass frit compositions described herein are given as weight percentages. These weight percentages are with respect to the total weight of the glass frit. The weight percentages are the percentages of the components used as starting materials in preparation of the glass frit compositions, on an oxide basis. As the skilled person will understand, starting materials such as oxides, carbonates or nitrates may be used in preparing the glass frits of the present invention. Where a non-oxide starting material is used to supply a particular element to the glass frit, an appropriate amount of starting material is used to supply an equivalent molar quantity of the element had the oxide of that element been supplied at the recited wt %. This approach to defining glass frit compositions is typical in the art. As the skilled person will readily understand, volatile species (such as oxygen) may be lost during the manufacturing process of the glass frit, and so the composition of the resulting glass frit may not correspond exactly to the weight percentages of starting materials, which are given herein on an oxide basis. Analysis of a fired glass frit by a process known to those skilled in the art, such as Inductively Coupled Plasma Emission Spectroscopy (ICP-ES), can be used to calculate the starting components of the glass frit composition in question.

In the present invention the glass frit is suitably a bismuth-based glass. For example, it may be a bismuth-cerium glass, a bismuth-molybdenum glass, a bismuth-tungsten glass, or a bismuth-alkali metal glass. Examples of bismuth-alkali metal glasses include bismuth-lithium glass and bismuth-sodium glass.

In certain embodiments the glass frit is a bismuth-alkali metal glass frit. In certain embodiments it is a bismuth-cerium glass frit.

Where the expressions "bismuth-X" glass or glass frit are used above (where X is cerium, molybdenum, tungsten or an alkali metal), the glass frit may be a glass frit prepared mainly from $Bi_2O_3$ and an oxide of 'X', for example $CeO_2$, $MoO_3$, $WO_3$, $Li_2O$ or $Na_2O$. In other words, $Bi_2O_3$ and the oxide of 'X' may be the components of the glass frit which are included in the highest wt %. Suitably, the sum of the wt % inclusion of {$Bi_2O_3$ and oxide of 'X'} is 50 wt % or greater. One of $Bi_2O_3$ or the oxide of 'X' may alone make up 50 wt % or greater of the glass frit. For example, $Bi_2O_3$ may make up 50 wt % or greater of the glass frit.

In some embodiments, the glass frit is substantially lead-free. As used herein, the term "substantially lead-free" is intended to include glass frits which contain no intentionally added lead. For example, the glass frit may include less than 0.1 wt % PbO, for example less than 0.05 wt %, less than 0.01 wt % or less than 0.005 wt % PbO.

In some embodiments, the glass frit is substantially boron-free. As used herein, the term "substantially boron-free" is intended to include glass frits which contain no intentionally added boron. For example, the glass frit may include less than 0.1 wt % $B_2O_3$, for example less than 0.05 wt %, less than 0.01 wt % or less than 0.005 wt % $B_2O_3$.

The glass frit may in some embodiments include $TeO_2$. For example, the glass frit may include 10 wt % or less $TeO_2$.

However, in some embodiments substantially no $TeO_2$ is included in the glass frit. That is, the glass frit may be substantially tellurium-free. As used herein, the term "substantially tellurium-free" is intended to include glass frits which contain no intentionally added tellurium. For example, the glass frit may include less than 0.1 wt % $TeO_2$, for example less than 0.05 wt %, less than 0.01 wt % or less than 0.005 wt % $TeO_2$.

The glass frit may include $Bi_2O_3$. The glass frit may include at least 10 wt %, at least 20 wt %, at least 30 wt %, at least 40 wt % or at least 50 wt % of $Bi_2O_3$. The glass frit may include 90 wt % or less, 85 wt % or less, 75 wt % or less or 70 wt % or less of $Bi_2O_3$. For example the glass frit may include 60 to 70 wt % of $Bi_2O_3$.

The glass frit may include $CeO_2$. The glass frit may comprise at least 0.1 wt %, at least 0.2 wt %, at least 0.5 wt %, at least 1 wt %, at least 1.5 wt %, at least 2 wt %, at least 2.5 wt %, at least 3 wt % $CeO_2$, at least 5 wt % $CeO_2$, at least 8 wt % $CeO_2$, at least 10 wt % $CeO_2$, at least 12 wt % $CeO_2$, at least 15 wt % $CeO_2$, or at least 18 wt % $CeO_2$. The glass frit may comprise 50 wt % or less, 45 wt % or less, 40 wt % or less, 35 wt % or less, 30 wt % or less, 27 wt % or less, 25 wt % or less, or 22 wt % or less of $CeO_2$. A suitable $CeO_2$ content is from 15 wt % to 25 wt %.

The glass frit may include $SiO_2$. For example, the glass frit may include 0 wt % or more, 0.1 wt % or more, 0.5 wt % or more or 1 wt % or more, 2 wt % or more or 2.5 wt % or more $SiO_2$. The glass frit may include 20 wt % or less, 15 wt % or less, 10 wt % or less, 7 wt % or less or 5 wt % or less $SiO_2$. For example, the glass frit may include 0.1 to 7 wt % of $SiO_2$.

In some embodiments, the glass frit is substantially silicon-free. As used herein, the term "substantially silicon-free" is intended to include glass frits which contain no intentionally added silicon. For example, the glass frit may include less than 0.1 wt % $SiO_2$, for example less than 0.05 wt %, less than 0.01 wt % or less than 0.005 wt % $SiO_2$.

The glass frit may include alkali metal oxide, for example one or more selected from $Li_2O$, $Na_2O$, $K_2O$, and $Rb_2O$, preferably one or more selected from $Li_2O$, $Na_2O$ and $K_2O$, more preferably one or both of $Li_2O$ and $Na_2O$. In some embodiments, it is preferred that the glass frit includes $Li_2O$.

The glass frit may include 0 wt % or more, 0.1 wt % or more, 0.5 wt % or more, 1 wt % or more, 2 wt % or more, 3 wt % or more, 4 wt % or more, 5 wt % or more or 6 wt % or more alkali metal oxide. The glass frit may include 15 wt % or less, 12 wt % or less, 10 wt % or less, 8 wt % or less, or 7 wt % or less alkali metal oxide.

The glass frit may include 0 wt % or more, 0.1 wt % or more, 0.5 wt % or more, 1 wt % or more, 2 wt % or more, 3 wt % or more or 4 wt % or more $Li_2O$. The glass frit may include 12 wt % or less, 10 wt % or less, 8 wt % or less, 7 wt % or less 6 wt % or less, or 5 wt % or less $Li_2O$. For example, the glass frit may include 4 to 5 wt % of $Li_2O$.

In some embodiments, it may be preferred that the glass frit includes both $Li_2O$ and $Na_2O$. The glass frit may include 0.1 wt % or more, 0.5 wt % or more, 1 wt % or more, 2 wt % or more, 3 wt % or more, 4 wt % or more, 5 wt % or more, or 6 wt % or more in total of $Li_2O$ and $Na_2O$. The glass frit may include 15 wt % or less, 12 wt % or less, 10 wt % or less, 9 wt % or less 8 wt % or less, or 7 wt % or less in total of $Li_2O$ and $Na_2O$.

The glass frit may include at least 0.1 wt % or at least 0.5 wt % of $Li_2O$ and at least 0.1 wt % or at least 0.5 wt % of $Na_2O$. The glass frit may include 10 wt % or less, 8 wt % or less, 6 wt % or less or 5 wt % or less of $Li_2O$ and 5 wt % or less, 4 wt % or less, 3 wt % or less or 2.5 wt % or less of $Na_2O$.

The glass frit may include ZnO. For example, the glass frit may include 0 wt % or more, 0.1 wt % or more, 0.5 wt % or more, 1 wt % or more or 1.5 wt % or more ZnO. The glass frit may include 15 wt % or less, 10 wt % or less, 7 wt % or less or 5 wt % or less ZnO. For example, the glass frit may include 0.5 to 7 wt % of ZnO.

In some embodiments, it may be preferred that the glass frit is substantially zinc-free. As used herein, the term "substantially zinc-free" is intended to include glass frits which contain no intentionally added zinc. For example, the glass frit may include less than 0.1 wt % ZnO, for example less than 0.05 wt %, less than 0.01 wt % or less than 0.005 wt % ZnO.

The glass frit may include $MoO_3$. For example, the glass frit may include 0 wt % or more, 0.1 wt % or more, 0.5 wt % or more of $MoO_3$. The glass frit may include 10 wt % or less, 5 wt % or less, or 3 wt % or less of $MoO_3$. For example, the glass frit may include 0.1 to 5 wt % of $MoO_3$.

In some embodiments, it may be preferred that the glass frit is substantially molybdenum-free. As used herein, the term "substantially molybdenum-free" is intended to include glass frits which contain no intentionally added molybdenum. For example, the glass frit may include less than 0.1 wt % $MoO_3$, for example less than 0.05 wt %, less than 0.01 wt % or less than 0.005 wt % $MoO_3$.

The glass frit may include $WO_3$. For example, the glass frit may include 0 wt % or more, 0.1 wt % or more, 0.5 wt % or more of $WO_3$. The glass frit may include 10 wt % or less, 5 wt % or less, or 3 wt % or less of $WO_3$. For example, the glass frit may include 0.1 to 5 wt % of $WO_3$.

In some embodiments, it may be preferred that the glass frit is substantially tungsten-free. As used herein, the term "substantially tungsten-free" is intended to include glass frits which contain no intentionally added tungsten. For example, the glass frit may include less than 0.1 wt % $WO_3$, for example less than 0.05 wt %, less than 0.01 wt % or less than 0.005 wt % $WO_3$.

The glass frit may include BaO. For example, the glass frit may include 0 wt % or more, 0.1 wt % or more, 0.5 wt % or more of BaO. The glass frit may include 10 wt % or less, 5 wt % or less, or 3 wt % or less of BaO. For example, the glass frit may include 0.1 to 5 wt % of BaO.

The glass frit may include $P_2O_5$. For example, the glass frit may include 0 wt % or more, 0.1 wt % or more, 0.5 wt % or more or 1 wt % or more $P_2O_5$. The glass frit may include 10 wt % or less, 7 wt % or less, 5 wt % or less or 3 wt % or less $P_2O_5$.

The glass frit may include further components, such as further oxide components. Typically, the glass frit will include 20 wt % or less, 10 wt % or less, 7 wt % or less, 5 wt % or less, 3 wt % or less, 2 wt % or less or 1 wt % or less in total of further components. The glass frit may include at least 0.1 wt % of further components. The further components may be one or more selected from the group consisting of $GeO_2$, CaO, $ZrO_2$, CuO, AgO and $Al_2O_3$.

For example, the glass frit may comprise:
0 to 20 wt % $TeO_2$;
50 to 75 wt % $Bi_2O_3$;
0.5 to 8 wt % $Li_2O$;
0 to 5 wt % $Na_2O$;
0 to 5 wt % $SiO_2$;
0.1 to 8 wt % ZnO;
0 to 3 wt % $MoO_3$; and
10 to 30 wt % $CeO_2$.

The glass frit may consist essentially of a composition as described herein, and incidental impurities. In that case, as the skilled person will readily understand that the total weight % of the recited constituents will be 100 wt %, any balance being incidental impurities. Typically, any incidental impurity will be present at 0.1 wt % or less, 0.05 wt % or less, 0.01 wt % or less, 0.05 wt % or less, 0.001 wt % or less or 0.0001 wt % or less.

The glass frit may consist essentially of:
0 to 20 wt % $TeO_2$;
50 to 75 wt % $Bi_2O_3$;
0.5 to 8 wt % $Li_2O$;
0 to 5 wt % $Na_2O$;
0 to 5 wt % $SiO_2$;
0.1 to 8 wt % ZnO;
0 to 3 wt % $MoO_3$;
10 to 30 wt % $CeO_2$;
0 to 3 wt % WO3;
0 to 5 wt % BaO;
0 to 10 wt % $P_2O_5$;
0 to 10 wt % of further components, which may optionally be selected from the group consisting of $GeO_2$, CaO, $ZrO_2$, CuO, AgO and $Al_2O_3$; and
incidental impurities.

The solids portion of the conductive paste of the present invention may include 0.1 to 15 wt % of glass frit. The solids portion of the conductive paste may include at least 0.2 wt %, for example at least 0.5 wt %, or at least 0.8 wt %, or at least 1 wt %, or at least 1.2 wt % or at least 1.5 wt % of glass frit. The solids portion of the conductive paste may include 10 wt % or less, 7 wt % or less, 5 wt % or less, 4 wt % or less or 3 wt % or less of glass frit.

Typically, the glass frit will have a softening point in the range from 200° C. to 400° C. For example, the glass frit may have a softening point in the range from 250° C. to 350° C. The softening point may be determined e.g. using DSC measurement according to the standard ASTM E1356 "Standard Test Method for Assignment of the Glass Transition Temperature by Differential Scanning calorimetry".

The particle size of the glass frit powder may be controlled in the present invention. Typically, the D50 particle size may be at least 0.1 µm, at least 0.4 µm, at least 0.5 µm, at least 0.6 µm, at least 0.7 µm, or at least 1 µm. The D50 particle size may be 15 µm or less, 10 µm or less, 5 µm or less, 4 µm or less, 3 µm or less or 2 µm or less, 1 µm or less, 0.9 µm or less or 0.8 µm or less. The particle size may be determined using a laser diffraction method (e.g. using a Malvern Mastersizer 2000).

Alternatively or additionally (with the caveat that, of course, the D90 particle size is always higher than the D50 particle size), the D90 particle size may be at least 0.1 µm, at least 0.5 µm, at least 1 µm, at least 1.4 µm, at least 1.5 µm, at least 1.6 µm, at least 1.7 µm or at least 1.8 µm. The D90 particle size may be 15 µm or less, 10 µm or less, 5 µm or less, 4 µm or less, 3 µm or less, 2 µm or less, 1.9 µm or less, 1.8 µm or less, 1.7 µm or less, 1.6 µm or less or 1 µm or less. The particle size may be determined using a laser diffraction method (e.g. using a Malvern Mastersizer 2000).

Using X-ray diffraction techniques, the present inventors have found that some of the glass frits they have prepared in fact include a crystalline portion. Accordingly, it will be understood that the glass frits described and defined herein may include a crystalline portion in addition to an amorphous glass phase. In particular, the present inventors have found that some glass frits which include $CeO_2$ as a component in fact include a portion of crystalline $CeO_2$, in addition to the amorphous glass phase. This is observed particularly where the glass frit recipe includes a large weight percent of $CeO_2$, (e.g. 5 wt % or more). Accordingly, it will be understood that the glass frits described herein may include crystalline $CeO_2$, and that the recited $CeO_2$ content of the frit relates to the total of $CeO_2$ in amorphous glass phase and crystalline phase in the frit. Similarly, where another component is present in a crystalline portion, the recited content of that component in the frit relates to the total of that component in amorphous glass phase and crystalline phase in the frit. The glass frit is typically obtained or obtainable by a process as described or defined herein.

Typically, the glass frit is prepared by mixing together the raw materials and melting them to form a molten glass mixture, then quenching to form the frit. Accordingly, described herein is a process for preparing a glass frit wherein the process comprises melting together starting materials for forming the frit, to provide a molten glass mixture, and quenching the molten glass mixture to form the frit. The process may further comprise milling the frit to provide the desired particle size.

The skilled person is aware of alternative suitable methods for preparing glass frit. Suitable alternative methods include water quenching, sol-gel processes and spray pyrolysis.

Glass Frit and Tellurium Compound

The conductive paste of the present invention contains both the glass frit and the tellurium compound described above. For certain purposes it is useful to consider these two components together.

The content ratio of glass frit to tellurium compound can be considered. This is most usefully done with a ratio of weights, that is, a ratio of the wt % inclusion of the glass frit and tellurium compound in the conductive paste (w/w).

The weight ratio of glass frit:tellurium compound may be, for example, within the range 1 part glass frit:9 parts tellurium compound (w/w) to 199 parts glass frit:1 part $TeO_2$ (w/w).

It may be that there are ≤150 parts glass frit:1 part $TeO_2$ (w/w), for example ≤100 parts glass frit:1 part $TeO_2$ (w/w), ≤75 parts glass frit:1 part $TeO_2$ (w/w), ≤50 parts glass frit:1 part $TeO_2$ (w/w), ≤25 parts glass frit:1 part $TeO_2$ (w/w), ≤10 parts glass frit:1 part $TeO_2$ (w/w), ≤7.5 parts glass frit:1 part $TeO_2$ (w/w), ≤5 parts glass frit:1 part $TeO_2$ (w/w), ≤4 parts glass frit:1 part $TeO_2$ (w/w), ≤3.5 parts glass frit:1 part $TeO_2$ (w/w), ≤3 parts glass frit:1 part $TeO_2$ (w/w), ≤2.8 parts glass frit:1 part $TeO_2$ (w/w), ≤2.5 parts glass frit:1 part $TeO_2$ (w/w), ≤2.3 parts glass frit:1 part $TeO_2$ (w/w), ≤2 parts glass frit:1 part $TeO_2$ (w/w), ≤1.8 parts glass frit:1 part $TeO_2$ (w/w), ≤1.5 parts glass frit:1 part $TeO_2$ (w/w), ≤1.3 parts glass frit:1 part $TeO_2$ (w/w), ≤1 part glass frit:1 part $TeO_2$ (w/w), ≤0.95 parts glass frit:1 part $TeO_2$ (w/w), ≤0.9 parts glass frit:1 part $TeO_2$ (w/w), ≤0.8 parts glass frit:1 part $TeO_2$ (w/w), ≤0.6 parts glass frit:1 part $TeO_2$ (w/w), ≤0.4 parts glass frit:1 part $TeO_2$ (w/w), or ≤0.2 parts glass frit:1 part $TeO_2$ (w/w).

It may be that there are ≥0.1 parts glass frit:1 part $TeO_2$ (w/w), for example ≥0.2 parts glass frit:1 part $TeO_2$ (w/w), ≥0.4 parts glass frit:1 part $TeO_2$ (w/w), ≥0.6 parts glass frit:1 part $TeO_2$ (w/w), ≥0.8 parts glass frit:1 part $TeO_2$ (w/w), ≥0.9 parts glass frit:1 part $TeO_2$ (w/w), ≥0.95 parts glass frit:1 part $TeO_2$ (w/w), ≥1 parts glass frit:1 part $TeO_2$ (w/w), ≥1.3 parts glass frit:1 part $TeO_2$ (w/w), ≥1.5 parts glass frit:1 part $TeO_2$ (w/w), ≥1.8 parts glass frit:1 part $TeO_2$ (w/w), ≥2 parts glass frit:1 part $TeO_2$ (w/w), ≥2.3 parts glass frit:1 part $TeO_2$ (w/w), ≥2.5 parts glass frit:1 part $TeO_2$ (w/w), ≥2.8 parts glass frit:1 part $TeO_2$ (w/w), ≥3 parts glass frit:1 part $TeO_2$ (w/w), ≥3.5 parts glass frit:1 part $TeO_2$ (w/w), ≥4 parts glass frit:1 part $TeO_2$ (w/w), ≥5 parts glass frit:1 part $TeO_2$ (w/w), ≥7.5 parts glass frit:1 part $TeO_2$ (w/w), ≥10 parts glass frit:1 part $TeO_2$ (w/w), ≥25 parts glass frit:1 part $TeO_2$ (w/w), ≥50 parts glass frit:1 part $TeO_2$ (w/w), ≥75 parts glass frit:1 part $TeO_2$ (w/w), or 100 parts glass frit:1 part $TeO_2$ (w/w).

The particle diameter for the glass frit and the tellurium compound may be controlled together. As explained above both may be individually controlled. They may also be considered together.

For example, the D50 particle size of both the glass frit and the tellurium compound may be at least 0.1 μm, at least 0.4 μm, at least 0.5 μm, at least 0.6 μm, at least 0.7 μm, or at least 1 μm. The D50 particle size of both the glass frit and the tellurium compound may be 15 μm or less, 10 μm or less, 5 μm or less, 4 μm or less, 3 μm or less, 2 μm or less, 1 μm or less, 0.9 μm or less or 0.8 μm or less. The particle size may be determined using a laser diffraction method (e.g. using a Malvern Mastersizer 2000).

Alternatively or additionally (with the caveat that, of course, the D90 particle size is always higher than the D50 particle size), the D90 particle size of both the glass frit and the tellurium compound may be at least 0.1 μm, at least 0.5 μm, at least 1 μm, at least 1.4 μm, at least 1.5 μm, at least 1.6 μm, at least 1.7 μm or at least 1.8 μm. The D90 particle size of both the glass frit and the tellurium compound may be 15 μm or less, 10 μm or less, 5 μm or less, 4 μm or less, 3 μm or less, 2 μm or less, 1.9 μm or less, 1.8 μm or less, 1.7 μm or less, 1.6 μm or less or 1 μm or less. The particle size may be determined using a laser diffraction method (e.g. using a Malvern Mastersizer 2000).

The same particle size limitations may apply if or when the glass frit and the tellurium compound are mixed or co-milled to form a particle mixture or conductive paste.

That is, a particle mixture including a glass frit and a tellurium compound as described herein, in which the particle size(s) are controlled as set out above, is contemplated, as is a conductive paste including such particles or such a particle mixture.

Conductive Paste

The conductive paste is suitable for forming a conductive track on a substrate. It is particularly suitable for forming a surface electrode on a semiconductor substrate, e.g. in a solar cell. The conductive paste may be a front side conductive paste.

The solids portion of the conductive paste of the present invention may include 85 to 99.9 wt % of electrically conductive material. For example, the solids portion may include at least 85 wt %, at least 90 wt %, at least 93 wt % or at least 95 wt % of electrically conductive material. The solids portion may include 99.9 wt % or less, 99.5 wt % or less or 99 wt % or less of electrically conductive material.

The electrically conductive material may comprise one or more metals selected from silver, copper, nickel and aluminium. Preferably, the electrically conductive material comprises or consists of silver. This is particularly preferable in solar cell applications, e.g. where the paste is intended for contact with an n-type emitter of a solar cell. In some embodiments, particularly where the paste is intended for contact with a p-type emitter of a solar cell, the conductive material may comprise aluminium, e.g. it may be a blend of silver and aluminium.

The electrically conductive material may be provided in the form of particles, e.g. metal particles. The form of the particles is not particularly limited, but may be in the form of flakes, spherical particles, granules, crystals, powder or other irregular particles, or mixtures thereof.

The particle size of the electrically conductive material is not particularly limited in the present invention. Typically, the D50 particle size may be at least 0.1 μm, at least 0.5 μm, or at least 1 μm. The D50 particle size may be 15 μm or less, 10 μm or less, 5 μm or less, 4 μm or less, 3 μm or less or 2 μm or less. The particle size may be determined using a laser diffraction method (e.g. using a Malvern Mastersizer 2000).

The sum content of glass frit and the tellurium compound in the solids portion of the conductive paste of the present invention may be 0.1 to 15 wt %. For example, the sum content of glass frit and tellurium compound in the solids portion may be at least 0.2 wt %, at least 0.5 wt %, at least 1 wt % or at least 2 wt %. The sum content of glass frit and tellurium compound in the solids portion may be 10 wt % or less, 7 wt % or less, 5 wt % or less or 3 wt % or less.

The solids portion may include one or more additional additive materials, e.g. 0 to 10 wt % or 0 to 5 wt % of additional additive material.

The conductive paste of the present invention can be manufactured in any known manner. For example, the conductive paste can be manufactured by mixing the organic medium, electrically conductive material, glass frit and tellurium compound in any order.

It is contemplated that the components are added to one another stepwise, one after another, or in groups or batches. Broadly, there is no limitation on which component is added to which first.

Indeed certain components may be pre-combined to form a mixture which is then added.

Any other components which are to be present in the paste may be added at any stage of the mixing.

In certain embodiments of the invention, the glass frit and tellurium compound are combined as a particle mixture. Then that particle mixture is used in the mixing process for the conductive paste.

For example, the glass frit and tellurium compound may be co-milled to form a particle mixture. That is, a particle mixture comprising a glass frit and a tellurium compound, obtainable by co-milling the glass frit and the tellurium compound, is contemplated.

The conductive paste can be manufactured by mixing the organic medium, electrically conductive material and particle mixture in any order. A conductive paste comprising an organic medium, an electrically conductive material and a particle mixture obtainable by co-milling the glass frit and the tellurium compound described herein is contemplated.

In certain embodiments, only part of the total content of glass frit intended for inclusion in the conductive paste is co-milled with the tellurium compound to form the particle mixture. In such embodiments, the remaining glass frit content is mixed with the particle mixture, electrically conductive material and organic medium as set out above.

Co-milling these components may have a beneficial effect. In some embodiments, co-milling may improve the homogeneity of the conductive paste. Furthermore, in some embodiments it may improve the properties of the resultant solar cells.

Organic Medium

The solids portion of the conductive paste of the present invention is dispersed in organic medium. The organic medium may constitute, for example, at least 2 wt %, at least 5 wt % or at least 9 wt % of the conductive paste. The organic medium may constitute 20 wt % or less, 15 wt % or less, 13 wt % or less or 10 wt % or less of the conductive paste.

Accordingly, it will be understood that the solids portion may constitute at least 80 wt %, at least 85 wt %, at least 87 wt % or at least 90 wt % of the conductive paste. The solids portion may constitute 98 wt % or less, 95 wt % or less or 91 wt % or less of the conductive paste.

The organic medium typically comprises an organic solvent with one or more additives dissolved or dispersed therein. As the skilled person will readily understand, the components of the organic medium are typically chosen to provide suitable consistency and rheology properties to permit the conductive paste to be printed onto a semiconductor substrate, and to render the paste stable during transport and storage.

Examples of suitable solvents for the organic medium include one or more solvents selected from the group consisting of butyl diglycol, butyldiglycol acetate, terpineol, diakylene glycol alkyl ethers (such as diethylene glycol dibutyl ether and tripropyleneglycol monomethylether), ester alcohol (such as Texanol®), 2-(2-methoxypropoxy)-1-propanol and mixtures thereof.

Examples of suitable additives include those dispersants to assist dispersion of the solids portion in the paste, viscosity/rheology modifiers, thixotropy modifiers, wetting agents, thickeners, stabilisers and surfactants.

For example, the organic medium may comprise one or more selected from the group consisting of rosin (kollophonium resin), acrylic resin (e.g. Neocryl®), alkylammonium salt of a polycarboxylic acid polymer (e.g. Dysperbik® 110 or 111), polyamide wax (such as Thixatrol Plus® or Thixatrol Max®), nitrocellulose, ethylcellulose, hydroxypropyl cellulose and lecithin.

Manufacture of a Surface Electrode and Solar Cell

The skilled person is familiar with suitable methods for the manufacture of a surface electrode of a solar cell. Similarly, the skilled person is familiar with suitable methods for the manufacture of a solar cell.

The method for the manufacture of a surface electrode of a solar cell typically comprises applying a conductive paste onto the surface of a semiconductor substrate, and firing the applied conductive paste.

The conductive paste may be applied by any suitable method. For example, the conductive paste may be applied by printing, such as by screen printing or inkjet printing. The conductive paste may be applied on a semiconductor substrate to form a light receiving surface electrode of a solar cell. Alternatively, the conductive paste may be applied on a semiconductor substrate to form a back side surface electrode of a solar cell. The solar cell may be an n-type or a p-type solar cell. The paste may be applied onto an n-type emitter (in a p-type solar cell), or onto a p-type emitted (in an n-type solar cell). Some solar cells are known as back junction cells. In this case, it may be preferred that the conductive paste of the present invention is applied to the back side surface of the semiconductor substrate of the solar cell. Such a back side surface is typically covered with an insulating passivation layer (e.g. SiN layer), similar to the anti-reflective coating applied to the light receiving surface of a solar cell.

The skilled person is aware of suitable techniques for firing the applied conductive paste. An example firing curve is shown in FIG. 1. A typical firing process lasts approximately 30 seconds, with the surface of the electrode reaching a peak temperature of about 800° C. Typically the furnace temperature will be higher to achieve this surface temperature. The firing may for example last for 1 hour or less, 30 minutes or less, 10 minutes or less or 5 minutes or less. The firing may last at least 10 seconds. For example, the peak surface temperature of the electrode may be 1200° C. or less, 1100° C. or less, 1000° C. or less, 950° C. or less, 900° C. or less, 800° C. or less or 750° C. or less. The peak surface temperature of the surface electrode may be at least 500° C. or at least 600° C.

The semiconductor substrate of the electrode may be a silicon substrate. For example, it may be a single crystal semiconductor substrate, or a multi crystal semiconductor substrate. Alternative substrates include CdTe. The semiconductor may for example be a p-type semiconductor or an n-type semiconductor.

The semiconductor substrate may comprise an insulating layer on a surface thereof. Typically the conductive paste of the present invention is applied on top of the insulating layer to form the electrode. Typically, the insulating layer will be non-reflective. A suitable insulating layer is SiNx (e.g. SiN). Other suitable insulating layers include $Si_3N_4$, $SiO_2$, $Al_2O_3$ and $TiO_2$.

Methods for the manufacture of a p-type solar cell may comprise applying a back side conductive paste (e.g. comprising aluminium) to a surface of the semiconductor substrate, and firing the back side conductive paste to form a back side electrode. The back side conductive paste is typically applied to the opposite face of the semiconductor substrate from the light receiving surface electrode.

In the manufacture of p-type solar cells, typically, the back side conductive paste is applied to the back side (non-light receiving side) of the semiconductor substrate and dried on the substrate, after which the front side conductive paste is applied to the front side (light-receiving side) of the semiconductor substrate and dried on the substrate. Alternatively, the front side paste may be applied first, followed by application of the back side paste. The conductive pastes are typically co-fired (i.e. the substrate having both front- and back-side pastes applied thereto is fired, to form a solar cell comprising front- and back-side conductive tracks).

The efficiency of the solar cell may be improved by providing a passivation layer on the back side of the substrate. Suitable materials include SiNx (e.g. SiN), $Si_3N_4$, $SiO_2$, $Al_2O_3$ and $TiO_2$. Typically, regions of the passivation layer are locally removed (e.g. by laser ablation) to permit contact between the semiconductor substrate and the back side conductive track. Alternatively, where pastes of the present invention are applied to the back side, the paste may act to etch the passivation layer to enable electrical contact to form between the semiconductor substrate and the conductive track.

Where ranges are specified herein it is intended that each endpoint of the range in independent. Accordingly, it is expressly contemplated that each recited upper endpoint of a range is independently combinable with each recited lower endpoint, and vice versa.

EXAMPLES

Glass Synthesis

Glass frits were prepared using commercially available raw materials. The compositions of the glass frits are given in Table 1. Each glass was made according to the following procedure.

Raw materials for the glass were mixed using a laboratory mixer. 100 g of the glass raw materials mixture was melted in ceramic crucible, in a Carbolite electrical laboratory furnace. The crucibles containing the raw material mixture were placed in the furnace while it was still cold, to avoid thermal shock and cracking of the ceramic crucible. Melting was carried out at 1000-1200° C. in air. The molten glass was quenched in water to obtain the glass frit. The frit was dried overnight in a heating chamber at 120° C., then wet milled in a planetary mill to provide particles having a D90 particle size of less than 2 µm (determined using a laser diffraction method using a Malvern Mastersizer 2000). Wet milling may be carried out in organic solvent or water.

Particle Mixture Synthesis

As shown in Table 1, in certain cases part of the glass frit was co-milled with $TeO_2$ powder using a planetary mill to provide particles having a D90 particle size of less than 2 µm.

several times in a triple roll mill, producing a homogeneous paste. Viscosities were adjusted by adding medium or solvent to have similar values at shear rate of 100 s$^{-1}$. The resulting paste compositions are given in Table 2.

For paste 1303BC, the inorganic additive $TeO_2$ was mixed with the commercial silver powder, particle mixture and organic medium for roll milling and paste production.

TABLE 2

Conductive Paste Compositions

| Paste | Silver (wt %) | Glass/mixture composition | (wt %) | Inorganic Additive | (wt %) | Organic Medium (wt %) |
|---|---|---|---|---|---|---|
| 1155LM | 88 | Comparative Example 1 | 2 | — | — | 10 |
| 1244BC | 88 | A | 2 | — | — | 10 |
| 1261BC | 88 | B | 2 | — | — | 10 |
| 1298BC | 87.5 | Comparative Example 1 | 2.5 | — | — | 10 |
| 1299BC | 87.5 | B | 2.5 | — | — | 10 |
| 1300BC | 87.5 | C | 2.5 | — | — | 10 |
| 1303BC | 87.5 | A | 1.4 | $TeO_2$ | 1.1 | 10 |

Preparation of Solar Cells

Multicrystalline wafers with sheet resistance of 90 Ohm/sq, 6 inches size, were screen printed on their back side with commercially available aluminum paste, dried in an IR Mass belt dryer and randomized in groups. Each of these groups was screen printed with a front side silver paste which was one of the conductive pastes described herein and set out in more detail above.

The screens used for the front side pastes had finger opening 50 µm. After printing the front side the cells were dried in the IR Mass belt dryer and fired in a Despatch belt furnace. The Despatch furnace had six firing zones with upper and lower heaters. The first three zones are programmed around 500° C. for burning of the binder from the paste, the fourth and fifth zone are at a higher temperature, with a maximum temperature of 945° C. in the final zone (furnace temperature). The furnace belt speed for this experiment was 610 cm/min. An example of solar cells firing profile is shown in FIG. 1. The recorded temperature was determined by measuring the temperature at the surface of the solar cell during the firing process using a thermocouple. The temperature at the surface of the solar cell did not exceed 800° C.

TABLE 1

Particle Mixture Compositions

| Composition | | | $TeO_2$ | $Li_2O$ | $Bi_2O_3$ | ZnO | $Ce_2O_3$ | $Na_2O$ | $MoO_3$ |
|---|---|---|---|---|---|---|---|---|---|
| Comparative Example 1 | $TeO_2$-containing glass | mol % | 52.46 | 15.57 | 14.58 | 6.86 | 6.24 | 3.0 | 1.29 |
| | | wt % | 45.0 | 2.5 | 36.5 | 3.0 | 11.0 | 1.0 | 1.0 |
| A | $TeO_2$-free glass | mol % | 0.0 | 32.73 | 30.70 | 14.43 | 13.13 | 6.29 | 2.72 |
| | | wt % | 0.0 | 4.5 | 66.4 | 5.5 | 20 | 1.8 | 1.8 |
| B | Co-milled 80 wt % composition A with 20 wt % $TeO_2$ | mol % | 25.2 | 24.5 | 22.9 | 10.8 | 9.4 | 4.7 | 2.6 |
| | | wt % | 20.1 | 3.6 | 53.3 | 4.4 | 15.3 | 1.4 | 1.9 |
| C | Co-milled 55 wt % composition A with 45 wt % $TeO_2$ | mol % | 52.46 | 15.57 | 14.58 | 6.86 | 6.24 | 3.0 | 1.29 |
| | | wt % | 45.0 | 2.5 | 36.5 | 3.0 | 11.0 | 1.0 | 1.0 |

Paste Preparation

Conductive silver pastes were prepared using a commercial silver powder and the above particle mixtures, the balance being standard organic medium. The paste was prepared by pre-mixing all the components and passing After cooling the fired solar cells were tested in an I-V curve tracer from Halm, model cetisPV-CTL1. The results are provided by the I-V curve tracer, either by direct measurement or calculation using its internal software.

(To minimize the influence of the contact area the cells were prepared using the same screen for printing, and the same viscosity paste in each individual test set. This ensures that the line widths of the compared pastes were substantially identical and had no influence on the measuring.)

Solar Cell Performance

Fill factor indicates the performance of the solar cell relative to a theoretical ideal (0 resistance) system. The fill factor correlates with the contact resistance—the lower the contact resistance the higher the fill factor will be. But if the inorganic additive of the conductive paste is too aggressive it could damage the pn junction of the semiconductor. In this case the contact resistance would be low but due to the damage of the pn junction (recombination effects and lower shunt resistance) a lower fill factor would occur. A high fill factor therefore indicates that there is a low contact resistance between silicon wafer and the conductive track, and that firing of the paste on the semiconductor has not negatively affected the pn junction of the semiconductor (i.e. the shunt resistance is high).

The quality of the pn junction can be determined by measuring the pseudo fill factor (SunsVoc FF). This is the fill factor independent of losses due to resistance in the cell. Accordingly, the lower the contact resistance and the higher the SunsVoc FF, the higher the resulting fill factor will be. The skilled person is familiar with methods for determining SunsVoc FF, for example as described in Reference 1. SunsVoc FF is measured under open circuit conditions, and is independent of series resistance effects.

Eta represents the efficiency of the solar cell, comparing solar energy in to electrical energy out. Small changes in efficiency can be very valuable in commercial solar cells.

TABLE 3

Solar Cell Tests PV171 and PV177 Results

| Paste | Glass/mixture | $U_{oc}$ (V) | FF (%) | SunsVoc FF (%) | Eta (%) | Series resistance (Ohm · cm$^2$) |
|---|---|---|---|---|---|---|
| | | PV171 | | | | |
| 1155LM | Comparative Example 1 (2.0 wt %) | 0.627 | 78.87 | 81.33 | 17.11 | 0.0023 |
| 1244BC | A (2.0 wt %) | 0.624 | 44.60 | 81.61 | 9.75 | 0.0338 |
| 1261BC | B (2.0 wt %) | 0.625 | 64.57 | 81.90 | 13.96 | 0.0141 |
| | | PV177 | | | | |
| 1298BC | Comparative Example 1 (2.5 wt %) | 0.624 | 78.64 | 81.13 | 17.33 | 0.0020 |
| 1299BC | B (2.5 wt %) | 0.623 | 51.40 | 81.77 | 11.07 | 0.0256 |
| 1300BC | C (2.5 wt %) | 0.624 | 78.19 | 81.29 | 17.11 | 0.0024 |
| 1303BC | A (1.4 wt %) + TeO$_2$ (1.1 wt %) | 0.627 | 77.83 | 80.66 | 17.05 | 0.0024 |

REFERENCES

1. A. McEvoy, T. Markvart, L. Castaner. Solar cells: Materials, Manufacture and Operation. Academic Press, second edition, 2013.

The invention claimed is:

1. A conductive paste for forming a conductive track on a substrate, the paste comprising a solids portion dispersed in an organic medium, the solids portion comprising an electrically conductive material, particles of a bismuth-cerium, bismuth-molybdenum, bismuth-tungsten, or bismuth-alkali metal glass frit and particles of a tellurium compound, wherein the glass frit is substantially lead-free and substantially boron-free and wherein the solids portion comprises 85 to 99.9 wt % of electrically conductive material, and wherein the content ratio of glass frit to tellurium compound is 4:1 to 11:9 w/w.

2. The conductive paste according to claim 1, wherein the glass frit includes less than 0.1 wt % PbO.

3. The conductive paste according to claim 1, wherein the glass frit includes less than 0.1 wt % B$_2$O$_3$.

4. The conductive paste according to claim 1, wherein the D90 particle size of the glass frit particles is 2 µm or less, and/or the D90 particle size of the tellurium compound particles is 2 µm or less.

5. The conductive paste according to claim 1, wherein the D50 particle size of the glass frit particles is 1 µm or less, and/or the D50 particle size of the tellurium compound particles is 1 µm or less.

6. The conductive paste according to claim 1, wherein the tellurium compound is a telluride or a tellurite.

7. The conductive paste according to claim 1, wherein the tellurium compound is selected from tellurium chloride, tellurium dioxide, tellurious acid compounds, zinc telluride, tellurium tetrabromide, aluminium telluride, cadmium telluride, hydrogen telluride, potassium telluride, sodium telluride, lithium telluride, gallium telluride, silver telluride, chromium telluride, germanium telluride, cobalt telluride, mercury telluride, tin telluride, tungsten telluride, titanium telluride, copper telluride, lead telluride, bismuth telluride, arsenic telluride, manganese telluride, molybdenum telluride, telluric acid, ammonium metatelluric acid, potassium metatelluric acid, rubidium metatelluric acid, sodium metatelluric acid, lead metatelluric acid, tellurium iodide, tellurium sulfide, diphenylditelluride, tellurium octylate, bismuth tellurite, silver tellurite, lithium tellurite, sodium tellurite, molybdenum tellurite, tungsten tellurite, zinc tellurite, and mixtures thereof.

8. A conductive paste for forming a conductive track on a substrate, the paste comprising a solids portion dispersed in an organic medium, the solids portion comprising an electrically conductive material, particles of a bismuth-cerium, bismuth-molybdenum, bismuth-tungsten, or bismuth-alkali metal glass frit and particles of a tellurium compound, wherein the glass frit is substantially lead-free and substantially boron-free and wherein the solids portion comprises 85 to 99.9 wt % of electrically conductive material, and wherein the glass frit contains less than 10 wt % of the tellurium compound.

9. The conductive paste as claimed in claim 8 wherein, the glass frit is substantially tellurium-free.

10. The conductive paste as claimed in claim 8 wherein, the glass frit includes less than 0.1 wt % TeO$_2$.

11. A method for the manufacture of a surface electrode of a solar cell, the method comprising applying a conductive paste to a semiconductor substrate, the conductive paste comprising a solids portion dispersed in an organic medium, the solids portion comprising an electrically conductive material, particles of a bismuth-cerium, bismuth-molybdenum, bismuth-tungsten, or bismuth-alkali metal glass frit and particles of a tellurium compound, wherein the glass frit is substantially lead-free and substantially boron-free, wherein the content ratio of glass frit to tellurium compound is 4:1 to 11:9 w/w, and wherein the solids portion comprises 85 to 99.9 wt % of electrically conductive material, and firing the applied conductive paste.

12. A method for the manufacture of a surface electrode of a solar cell, the method comprising applying a conductive paste to a semiconductor substrate, the conductive paste comprising a solids portion dispersed in an organic medium, the solids portion comprising an electrically conductive material, particles of a bismuth-cerium, bismuth-molybdenum, bismuth-tungsten, or bismuth-alkali metal glass frit and particles of a tellurium compound, wherein the glass frit is substantially lead-free and substantially boron-free, wherein the glass frit contains less than 10 wt % of the tellurium compound, and wherein the solids portion comprises 85 to 99.9 wt % of electrically conductive material, and firing the applied conductive paste.

\* \* \* \* \*